United States Patent
Zhurin et al.

(10) Patent No.: US 6,454,910 B1
(45) Date of Patent: Sep. 24, 2002

(54) ION-ASSISTED MAGNETRON DEPOSITION

(75) Inventors: Viacheslav V. Zhurin, Ft. Collins, CO (US); Harold R. Kaufman, LaPorte, CO (US); James R. Kahn, Ft. Collins, CO (US); Kirk A. Thompson, Ft. Collins, CO (US)

(73) Assignee: Kaufman & Robinson, Inc., Ft. Collins, CO (US)

( * ) Notice: Subject to any disclaimer, the term of this patent is extended or adjusted under 35 U.S.C. 154(b) by 0 days.

(21) Appl. No.: 09/960,002

(22) Filed: Sep. 21, 2001

(51) Int. Cl.[7] .............................................. C23C 14/34
(52) U.S. Cl. ........................ 204/192.12; 204/192.13; 204/298.03; 204/298.06; 204/298.19; 204/298.26
(58) Field of Search ...................... 204/192.11, 192.12, 204/192.13, 298.03, 298.04, 298.06, 298.19, 298.26

(56) References Cited

U.S. PATENT DOCUMENTS

| | | | |
|---|---|---|---|
| 4,541,890 A | * | 9/1985 | Cuomo et al. ............... 156/345 |
| 4,579,639 A | * | 4/1986 | Enomoto et al. ...... 204/192.13 |
| 5,122,252 A | * | 6/1992 | Latz et al. .............. 204/298.26 |

* cited by examiner

Primary Examiner—Rodney G. McDonald
(74) Attorney, Agent, or Firm—Dean P. Edmundson (57) ABSTRACT

In accordance with an embodiment of the present invention, apparatus for ion-assisted magnetron deposition takes a form that includes a magnetron, a deposition substrate displaced from the magnetron, and an ion source also displaced from the magnetron and located so that the ion beam from the ion source is directed at the deposition substrate. The ion source is operated without an electron-emitting cathode-neutralizer, the electron current for this function being provided by electrons from the magnetron. In one specific embodiment, the ion source is operated so that the potential of the deposition substrate is maintained close to that of a common ground for the magnetron and the ion source. In another embodiment, the ion source is of the Hall-current type and the discharge current of the ion source is approximately equal in magnitude to the current of the magnetron discharge.

8 Claims, 8 Drawing Sheets

ION-ASSISTED MAGNETRON DEPOSITION

FIELD OF INVENTION

This invention relates generally to ion and plasma technology, and more particularly it pertains to ion-assisted deposition from magnetrons wherein the ions from an ion source compact, react with, or otherwise modify the thin film deposited by a magnetron.

BACKGROUND ART

Deposition of thin films by sputtering is widely used. The technology of magnetrons with planar targets is described by Waits in Chapter II-4 of *Thin Film Processes* (John L. Vossen and Werner Kern, eds.), Academic Press, New York (1978) beginning on page 131. Sputtering targets with other than planar shapes have also been used in magnetrons, as described in U.S. Pat. No. 2,146,025—Penning and in U.S. Pat. No. 3,616,450—Clarke. A related deposition technology is the use of energetic ion beams directed at sputter targets to deposit thin films on substrates as described by Harper in Chapter II-5 of the aforesaid *Thin Film Processes* beginning on page 131. These publications are incorporated herein by reference.

The modification of thin films by the simultaneous bombardment of a depositing film with energetic ions is called ion-assisted deposition. The acceleration of ions to form energetic beams of such ions has been accomplished electrostatically as described in U.S. Pat. No. 3,156,090—Kaufman and in the aforementioned chapter II-4 by Harper in *Thin Film Processes*. The ion generation in these ion sources has been by a direct-current discharge. It is also possible to use electrostatic ion acceleration with a radio-frequency discharge, as described in U.S. Pat. No. 5,274,306—Kaufman, et al.

The acceleration has also been accomplished electromagnetically with a discharge between an electron-emitting cathode and an anode. The accelerating electric field is established by the interaction of the electron current in this discharge with a magnetic field located in part or all of the discharge region. This interaction generally includes the generation of a Hall current normal to both the magnetic field direction and the direction of the electric field that is established. For the Hall current to be utilized efficiently, it must traverse a closed path.

A Hall-current ion source can have a circular discharge region with only an outside boundary, where the ions are accelerated continuously over the circular cross section of this region. This type of Hall-current ion source is called an end-Hall ion source and has a generally axial magnetic field shape as shown in U.S. Pat. No. 4,862,032—Kaufman et al., and as described by Kaufman, et al., in *Journal of Vacuum Science and Technology A*, Vol. 5, No. 4, beginning on page 2081. These publications are incorporated herein by reference.

A Hall-current ion source can also have an annular acceleration region with both inner and outer boundaries, where the ions are accelerated only over an annular cross section. This type of Hall-current ion source is called a closed-drift ion source and usually has a generally radial magnetic field shape as shown in U.S. Pat. No. 5,359,258—Arkhipov, et al., and U.S. Pat. No. 5,763,989—Kaufman, and as described by Zhurin, et al., in *Plasma Sources Science & Technology*, Vol. 8, beginning on page R1.

As described in the prior-art discussion of the aforesaid U.S. Pat. No. 5,763,989, closed-drift ion sources can be divided into magnetic layer and anode layer types, with the presence of a dielectric wall and a longer discharge region being the primary distinguishing features of the magnetic layer type. The operation of the anode-layer type can be further divided into quasineutral and vacuum regimes. As further described by Zhurin, et al., in the aforesaid article in *Plasma Sources Science & Technology*, operation in the vacuum regime is characterized by a high discharge voltage and a low discharge current. All of the above described Hall-current ion source types and their operating regimes use an electron-emitting cathode such as a hot filament or a hollow cathode, except for the anode-layer type operating in the vacuum regime. For the electron current to sustain the discharge, the latter depends on electron emission from cathode-potential surfaces that results from ion bombardment of those surfaces, from field-enhanced emission, and from neutralization arcs. An example of an anode-layer type of ion source operating in the vacuum regime is described in U.S. Pat. No. 6,147,354—Maishev, et al. The above ion source publications are also incorporated herein by reference.

The cross sections of the acceleration regions in the preceding discussion are described above as being circular or annular, but it should be noted the cross sections can have other shapes such as an elongated or "race-track" shape. Such alternative shapes are described in the references cited. It should also be noted that the magnetic field shape can depend on the desired beam shape. For example, an ion beam directed radially outward would have a magnetic field generally at right angles to the magnetic field used to generate an axially directed ion beam.

Ion-assisted deposition has been carried out using ion-beam sources for both sputtering from a target and the ion-assist bombardment of the depositing film. In such deposition, a gridded ion source is almost always used for generating the ion beam directed at the sputter target, as described in U.S. Pat. No. 4,419,203—Harper, et al., and U.S. Pat. No. 4,490,229—Mirtich, et al.

Ion-assisted deposition has also been carried out using a magnetron to sputter from a sputtering target and an ion source for the generation of ion-assist ions, as described in U.S. Pat. No. 5,525,199—Scobey and U.S. Pat. No. 6,153,067—Maishev, et al.

Ion-assisted deposition can enhance properties of deposited thin films by increasing their density, increasing their hardness, modifying their stress, promoting crystalline alignment, selecting a preferred molecular bond, increasing their adhesion to the substrates upon which they are deposited, and promoting the formation of a particular compound (such as an oxide or nitride) by bombarding with ions of one of the elements (such as oxygen or nitrogen ions). These property enhancements are described by Harper, et al. in Chapter 4 of *Ion Bombardment Modification of Surfaces: Fundamentals and Applications* (Auciello, et al, eds.), Elsevier Science Publishers B. V., Amsterdam (1984), beginning on page 127; by Kay, et al. in Chapter 10 of Handbook of Ion Beam Processing Technology (Cuomo, et al., eds.) Noyes Publications, Park Ridge, N.J. (1989) beginning on page 170; and by Roy, et al. in Chapter 11 of the aforesaid *Handbook of Ion Beam Processing Technology*, beginning on page 194. The above ion-assisted deposition publications are also incorporated herein by reference.

An acceptable energy range for ion-assist ions in low-damage deposition can be determined from the above publications. Essentially all deposition processes appear to show some degree of damage at ion-assist energies above 300 eV.

Quite a few processes show damage at energies greater than 100 eV, while some show damage at energies greater than 50 eV. For low-damage, ion-assisted applications, then, the ion energies should definitely be less than 300 eV and preferably less than 100 eV. In general, gridded ion sources as described by Harper in the aforesaid Chapter II-5 of *Thin Film Processes* have limited ion-beam current capacity at low energies and are therefore not well suited to ion-assist deposition at the low end of the <300 eV energy range. In comparison, Hall-current ion sources usually have substantial ion-current capacity at 100 eV, or even less.

A general trend in thin-film deposition has been the increasing suppression or elimination of damage-producing mechanisms, with the objective of producing deposited films that are nearly or completely free from damage. The control of impurities has been important in reducing damage in the form of departures from uniform and controlled composition.

Impurities have been decreased by reducing or eliminating the sputtering of non-target hardware. A general reduction of contamination has also been obtained by reducing the vacuum-chamber pressures. While low operating pressures can be important, the use of vacuum chambers with low pressures prior to operation is probably more important. This is because high-purity process gases can be used to reduce impurities during operation, but a high pressure prior to operation means that impurities from outgassing and/or leaks will be present during operation regardless of the purity of the working gases. Load-lock vacuum systems, where the vacuum chamber remains at vacuum while substrates are introduced and removed from the vacuum chamber through auxiliary vacuum chambers are effective for reducing the contamination due to outgassing. To offset the reduced impurities, however, the sputter equipment used in such systems must be capable of operating for long times between maintenance.

A more recent contribution to the deposition of low-damage films has been the control of substrate charging. This control is obtained by controlling the plasma potential in the vacuum chamber—i.e., by keeping it close to the potential of the substrate and the surrounding vacuum chamber. Large excursions in plasma potential can cause the neutralization arcs mentioned in connection with an anode-layer ion source operating in the vacuum regime. These arcs can also be generated when other types of ion sources are operated at improper conditions. These are arcs between the plasma and the substrate or between the plasma and the surrounding hardware. Neutralization arcs have a very short duration and a typical visible length of 1–2 mm. When such arcs are frequent, they can give a sparkling appearance in a dimly lit vacuum chamber. Damage from neutralization arcs can be in the form of arc pits at the origin of the arcs or particulates from these arcs being deposited elsewhere.

Reduction or elimination of neutralization arcs in a gridded ion source has been obtained by operating the cathode-neutralizer emission at a value equal to or slightly greater than the ion beam current, as described by Kaufman, et al. in *Operation of Broad-Beam Ion Sources*, Commonwealth Scientific Corporation, Alexandria, Va. (1987), starting with page 49. For a Hall-current ion source, the reduction or elimination of neutralizing arcs has been obtained by operating the cathode at an emission value equal to or slightly greater than the discharge (anode) current as also described by Kaufman, et al., in the aforesaid *Operation of Broad-Beam Ion Sources*, starting with page 60.

The most recent work on reducing substrate damage by reducing substrate charging has focused not just on the elimination of neutralization arcs, but on the reduction of substrate charging to well below the level where such arcs are observed. Problems have been encountered with electrostatic charging during ion beam etching, as described in an article by Olson in the *EOS/ESD Symposium*, Paper No. 98-332 (1998), also incorporated herein by reference. These problems have been most serious when portions of the work piece at which the ion beam is directed are electrically isolated from each other. Differential charging of these isolated portions can result in an electrical breakdown between the two portions. Such a breakdown will damage the work piece.

SUMMARY OF INVENTION

In light of the foregoing, it is an object of the invention to provide an apparatus using a magnetron sputtering source that can be used in ion-assisted deposition to deposit films that are substantially free of damage sites.

Another object of the invention is to provide an ion-assisted magnetron deposition apparatus that does not require operation of an electron-emitting cathode.

Yet another object of the present invention is to provide an ion-assisted magnetron deposition apparatus that is capable of extended operation without maintenance.

Still another object of the present invention is to provide an ion-assisted magnetron deposition apparatus in its simplest, most reliable form.

In accordance with an embodiment of the present invention, apparatus for ion-assisted magnetron deposition takes a form that includes a magnetron, a deposition substrate displaced from the magnetron, and an ion source also displaced from the magnetron and located so that the ion beam from the ion source is directed toward the deposition substrate. The ion source is operated without an electron-emitting cathode-neutralizer, the electron current for this function being provided by electrons from the magnetron. In one specific embodiment, the ion source is operated so that the potential of the deposition substrate is maintained close to that of a common ground for the magnetron and the ion source. In another embodiment, the ion source is of the Hall-current type and the discharge current of the ion source is approximately equal in magnitude to the current of the magnetron discharge.

DESCRIPTION OF FIGURES

Features of the present invention which are believed to be patentable are set forth with particularity in the appended claims. The organization and manner of operation of the invention, together with further objectives and advantages thereof, may be understood by reference to the following descriptions of specific embodiments thereof taken in connection with the accompanying drawings, in the several figures of which like reference numerals identify like elements and in which:

It may be noted that some of the aforesaid schematic views contain cross sections or portions of cross sections in which the surfaces in the plane of the section are shown while avoiding the clutter which would result were there also a showing of the background edges and surfaces.

DESCRIPTION OF PRIOR ART

Figure 1:
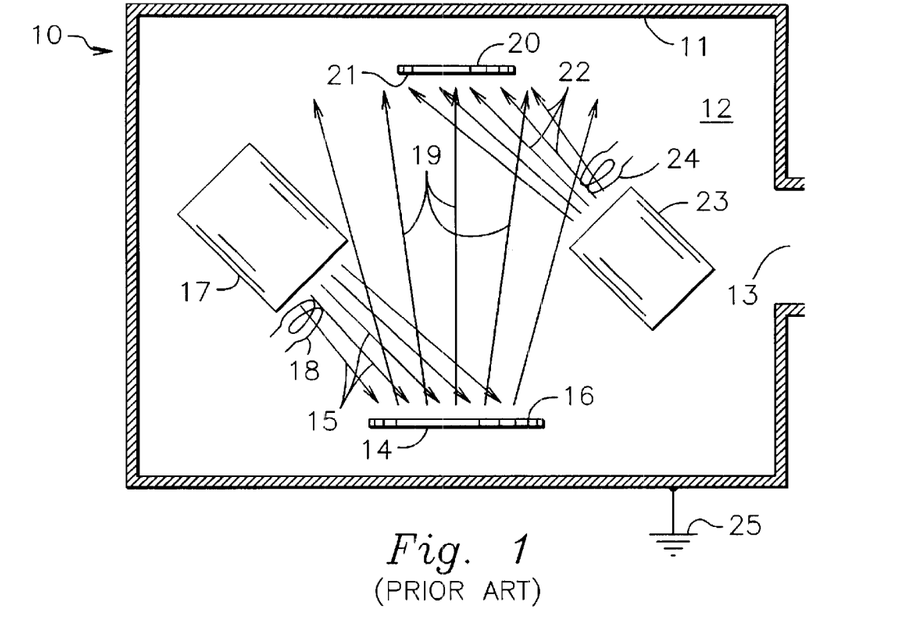
FIG. 1 is a prior-art ion-assisted deposition apparatus using an energetic ion beam to generate sputtered material.

Referring to FIG. 1, there is shown a prior-art ion-assisted deposition apparatus 10 using an energetic ion beam to generate sputtered material. There is a vacuum enclosure 11 which surrounds evacuated volume 12, with the latter maintained at a low pressure by sustained-pumping through port 13. Within the evacuated volume, there is sputter target 14. Energetic ion beam 15 impinges upon exposed surface 16 of target 14. The sputtering ion beam is generated by ion source 17 used together with cathode-neutralizer 18. The ion beam is sufficiently energetic that particles of target 14 are sputtered, following trajectories 19. Some of the sputtered particles are deposited on deposition substrate 20, being deposited as a thin film on exposed surface 21 of the substrate. To perform the ion-assist function, an ion-assist ion beam 22 is directed at substrate 20, striking exposed surface 21 upon which the film is being deposited. The ion-assist ion beam is generated by the ion-assist ion source 23 used together with cathode-neutralizer 24. In such an apparatus, ion source 17 is usually a gridded type. This choice results from the need for a well-defined ion beam that is confined to the exposed surface 16 of sputter target 14, in addition to the ion energy being high enough to generate a substantial sputtering rate. The ion-assist ion source 23 can be of either the gridded or Hall-current type. Historically, the gridded type has been used more frequently, but the need to avoid unnecessary film damage during the deposition process by using a low enough ion energy, while retaining a high process rate with a substantial ion current, has resulted in increased use of the Hall-current type.

When making a simplified representation of an ion source in an-apparatus using one or more ion sources, it is common to show a single block for an ion source, where the ion source is assumed to include a cathode-neutralizer. Examples of such representation are FIG. 1 in U.S. Pat. No. 6,238,537—Kahn, et al.; FIGS. 2, 3, and 5 in the aforementioned U.S. Pat. No. 5,525,199—Scobey; and FIG. 4.3 in the aforesaid chapter 4 by Harper, et al., in *Ion Bombardment Modification of Surfaces: Fundamentals and Applications*. For the purposes of this presentation, however, it is more appropriate to define a cathode-neutralizer as being separate and distinct from the ion source with which it may be associated. It may also be noted that the name "cathode-neutralizer" is used for both what is usually called a "cathode" in a Hall-current ion source and a "neutralizer" in a gridded source.

Figure 2:
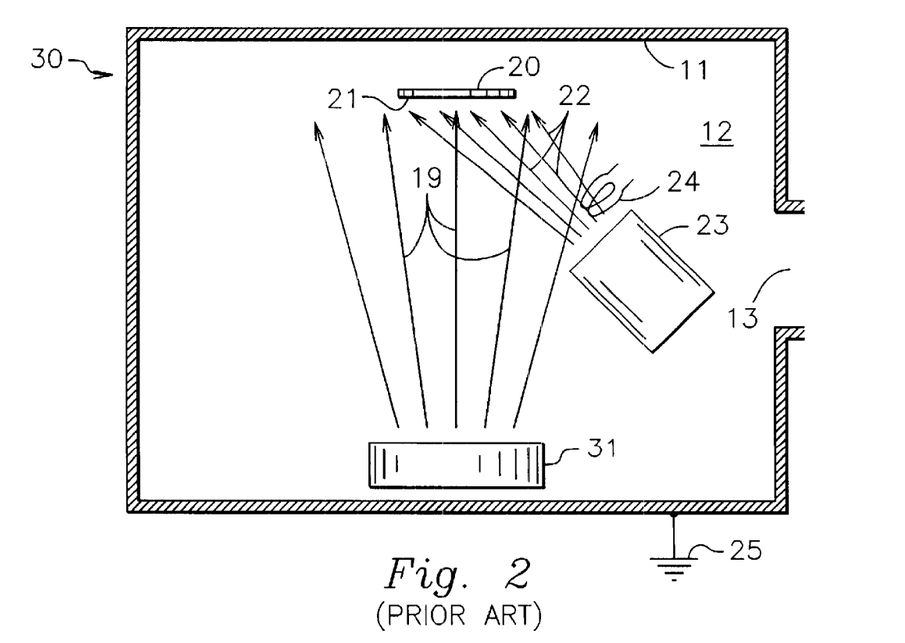
FIG. 2 is a prior-art ion-assisted deposition apparatus using a magnetron to generate sputtered material.

Referring to FIG. 2, there is shown a prior-art ion-assisted deposition apparatus 30 using a magnetron to generate sputtered material. There is a vacuum enclosure 11 which surrounds evacuated volume 12, with the latter maintained at a low pressure by sustained pumping through port 13. Within the evacuated volume, there is magnetron 31. The magnetron generates sputtered particles of a target incorporated within the magnetron, with these particles following trajectories 19. Some of the sputtered particles are deposited on deposition substrate 20, being deposited as a thin film on exposed surface 21 of the substrate. To perform the ion-assist function, an ion-assist ion beam 22 is directed at substrate 20, striking exposed surface 21 upon which the film is being deposited. The ion-assist ion beam is generated by the ion-assist ion source 23 used together with cathode-neutralizer 24. The ion-assist ion source 23 can be of either the gridded or Hall-current type.

Figure 3:
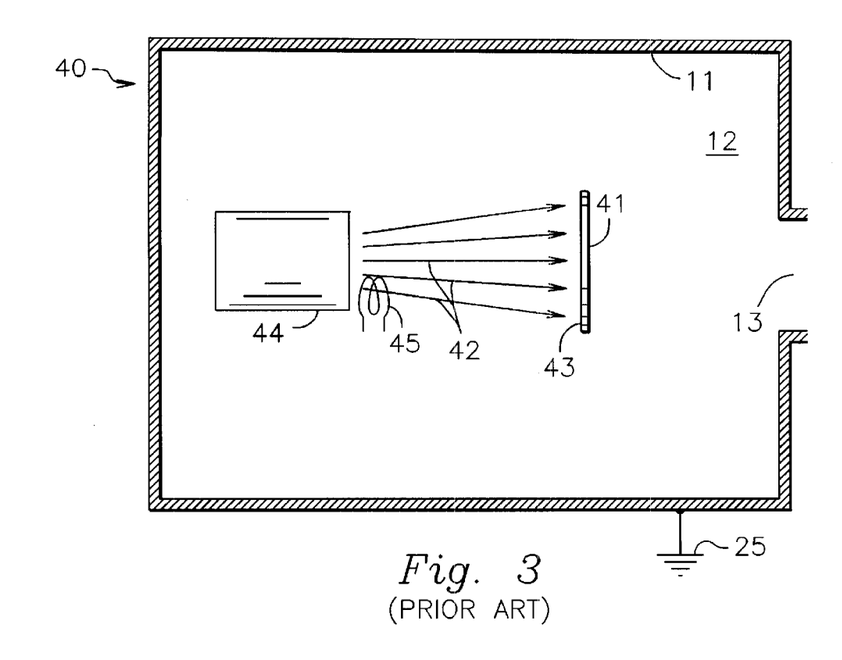
FIG. 3 is a prior-art ion source with a neutralized ion beam.

FIG. 3 is shown a prior-art ion-source apparatus 40. This ion source can be of either the gridded or Hall-current type. The following discussion is presented for the purpose of describing neutralization requirements for ion sources, whether they are used as sputtering ion sources (e.g., ion source 17 in FIG. 1) or as ion-assist ion sources (e.g., ion source 23 in FIG. 1). There is a vacuum enclosure 11 which surrounds evacuated volume 12, with the latter maintained at a low pressure by sustained pumping through port 13. Within the evacuated volume there is ion-beam target 41. This target can represent a sputter target (e.g., target 14 in FIG. 1) or a deposition substrate (e.g., substrate 20 in FIG. 1). Energetic ion beam 42 impinges on exposed surface 43 of target 41. The ion beam is generated by ion source 44 used together with cathode-neutralizer 45. Note that the cathode-neutralizer is again defined as being separate and distinct from the ion source with which it is associated.

Figure 4:
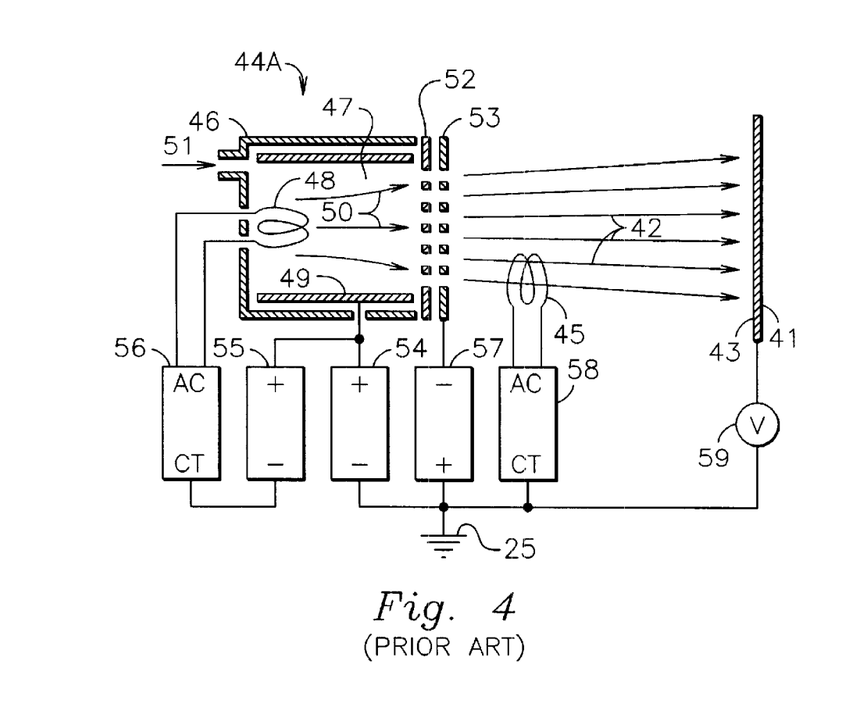
FIG. 4 is an electrical schematic of the ion source in FIG. 3 where the ion source is of the gridded type.

Referring to FIG. 4, there is shown the electrical schematic for the ion-source apparatus shown in FIG. 3, with the ion source of the gridded type, as described in the aforementioned U.S. Pat. No. 3,156,090—Kaufman and in the aforementioned chapter II-4 by Harper in *Thin Film Processes*. Gridded ion source 44A has outer enclosure 46 that surrounds volume 47. Within this volume is electron-emitting discharge-chamber cathode 48 and anode 49. Electrons emitted by cathode 48 are constrained by magnetic field 50 and reach anode 49 only as the result of a variety of collision processes. Some of these collisions are with ionizable gas 51 introduced into volume 47 and generate ions. Some of the ions which are generated reach screen grid 52 and accelerator grid 53 and are accelerated out of volume 47 by the negative potential of the accelerator grid. There are apertures in the screen grid and accelerator grid that are aligned with each other, so that in normal operation the accelerated ions continue through the two grids to form ion beam 42. The ions in the ion beam have a positive charge that must be neutralized by the addition of neutralizing electrons. The neutralizing electrons are emitted by cathode-neutralizer 45.

The electrons and ions in volume 47 constitute an electrically conductive gas, or plasma, which is approximately at the potential of anode 49. The electrical potential of beam supply 54 thus determines the ion energy of the ions in ion beam 42. In normal operation (energetic accelerated ions not striking accelerator grid 53) the ion current in ion beam 42 equals the current in beam supply 54. The electrical discharge power to generate the ions is supplied by discharge supply 55. The discharge-chamber cathode in FIG. 4 is indicated as being a thermionically emitting hot wire. The power to heat this cathode comes from cathode supply 56, which is usually in the form of an alternating-current transformer. The two ends of the transformer secondary are attached to the ends of cathode 48, while the center-tap of the secondary is attached to the negative end of discharge supply 55. The discharge-chamber cathode could also be of the hollow-cathode type, which would require a different cathode-supply configuration. Alternatively, the discharge power could be radiofrequency power as opposed to direct-current power, and no discharge-chamber cathode would be required.

The negative accelerator-grid voltage is provided by accelerator supply 57. Cathode-neutralizer 45 in FIG. 4 is indicated as being a thermionically emitting hot wire. The power to heat this cathode comes from cathode-neutralizer supply 58, which is usually in the form of an alternating-current transformer. The two ends of the transformer secondary are attached to the ends of cathode-neutralizer 45, while the center-tap of the secondary is connected to the common ground connection, typically the potential of vacuum enclosure (11 in FIG. 3), which is usually, but not always, connected to earth ground. The neutralizer-cathode could also be of the hollow-cathode type, which would again require a different power supply configuration. The hot-filament, hollow-cathode, and plasma-bridge types of neutralizers are described in "Ion Beam Neutralization," anon., CSC Technical Note, Commonwealth Scientific Corporation, Alexandria, Va. (1991).

To complete the description of FIG. 4, ion-beam target 41 is electrically isolated from ground, with the potential of this target relative to ground measured with voltmeter 59. This isolation is not typical of ion-beam apparatuses, but has been used in neutralization tests to determine optimum operating conditions for cathode-neutralizers.

Figure 5:
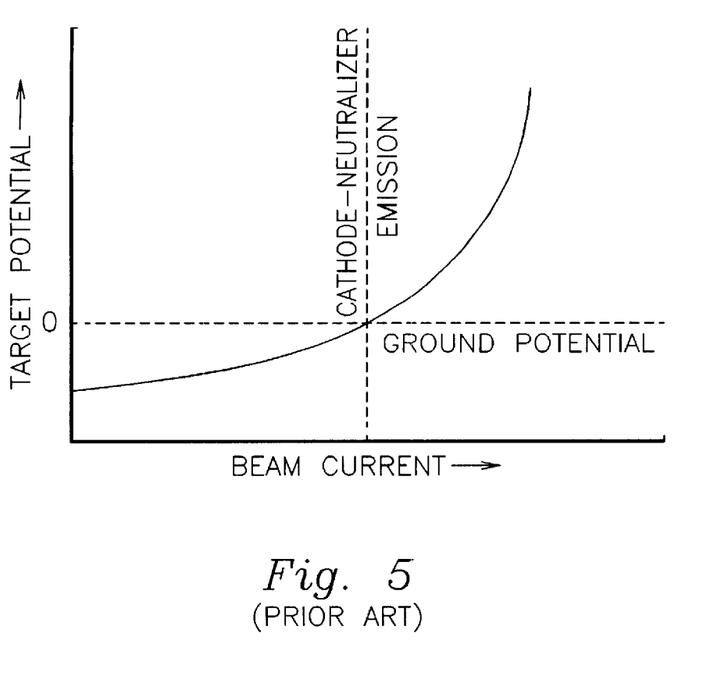
FIG. 5 depicts the variation in potential .of an electrically isolated target with ion beam current when the ion source is of the type shown in FIG. 4 and the cathode-neutralizer emission is fixed.

The variation of the potential of an electrically isolated ion-beam target with ion-beam current is depicted in FIG. 5 for an ion-beam apparatus corresponding to both FIG. 3 and the electrical schematic of FIG. 4. The cathode-neutralizer is assumed to be operating at a fixed electron emission. The variation of ion-beam current (the current in beam supply 54) then results in the variation in target potential shown in FIG. 5. Of particular interest is the target potential reaching zero potential relative to ground close to or at an ion-beam current, $I_i$ equal in magnitude to the cathode-neutralizer emission, $I_e$. The equality $$I_i = I_e \tag{1}$$

is called current neutralization. If there is an excess of arriving ions, the target potential will become positive to attract additional electrons, as shown in FIG. 5. If there is a deficiency of arriving ions, the target potential will become negative to repel more of the arriving electrons, as also shown in FIG. 5.

For a normally grounded target, the condition of current neutralization represents the minimum likelihood of charging damage at the target surface 43. Those skilled in plasma physics will recognize that operation with current neutralization will not avoid a potential difference between the ion beam and a normally grounded ion-beam target. This potential difference does not go to zero because there is a plasma sheath formed at the target surface, where the potential difference across the, sheath is sufficient to reduce the electron loss rate from the ion beam to equal the ion arrival rate. If the ion-beam current departs from current neutralization, there will be net currents to or from a conducting target surface. If there are insulated portions of the target surface, such as oxide, nitrides, or photoresist, charges will build up on these surfaces relative to the bulk of the target. If the ion beam potential becomes too positive (i.e., the ion-beam current exceeds the cathode-neutralizer emission by too large an amount), neutralization arcs will be drawn from the target surface or surrounding hardware. To minimize damage to any thin films or thin-film devices that are involved in an ion-beam process, it is generally necessary that any ion sources involved be operated with approximate current neutralization.

Figure 6:
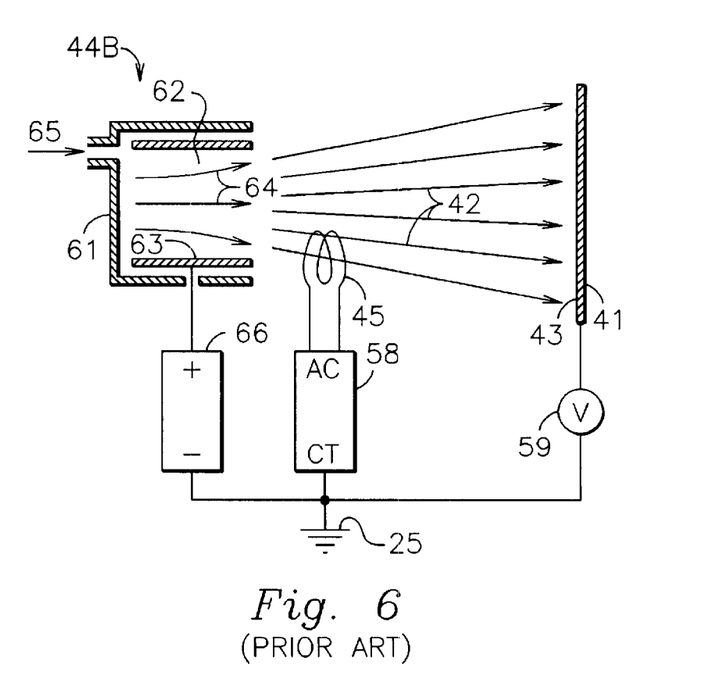
FIG. 6 is an electrical schematic of the ion source in FIG. 4 where the ion source is of the Hall-current type.

Referring to FIG. 6, there is shown an alternative representation of the ion-beam apparatus shown in FIG. 3. In this case the ion source 44B is of the Hall-current type, either the end-Hall type as described by Kaufman, et al., in the aforementioned article in *Journal of Vacuum Science and Technology A*, Vol. 5, No. 4, beginning on page 2081, or of the closed-drift type as described by Zhurin, et al., in the aforementioned article in Plasma Sources Science & Technology, Vol. 8, beginning on page R1. Hall-current ion source 44B has outer enclosure 61 that surrounds volume 62. Within this volume is anode 63 and magnetic field 64. Electrons emitted by cathode-neutralizer 45 are constrained by the magnetic field and reach the anode only as the result of a variety of collision processes. Some of these collisions are with ionizable gas 65 introduced into volume 62 and generate ions. Some of the ions generated are accelerated out of volume 62 by the electric field generated by the interaction of the electron current in volume 62 with the magnetic field 64 in the same volume, to form ion beam 42. The ions in the ion beam have a positive charge that must be neutralized by the addition of neutralizing electrons from cathode-neutralizer 45.

The electrical discharge in volume 62 is energized by discharge supply 66. The electrical potential of the discharge supply determines the ion energy of the ions in ion beam 42, but the ion energy generally corresponds to only 60–90 percent of the discharge voltage depending on the specific type of Hall-current source and its specific operating condition. In a similar manner, the ion current in the ion beam corresponds to only 20–90 percent of the discharge current. Cathode-neutralizer 45 in FIG. 6 is again indicated as being a thermionically emitting hot wire. The power to heat this cathode again comes from cathode-neutralizer supply 58, which is usually in the form of an alternating-current transformer. The two ends of the transformer secondary are attached to the ends of cathode-neutralizer 45, while the center-tap of the secondary is connected to the common ground connection, typically the potential of vacuum enclosure (11 in FIG. 3), which is usually, but not always, connected to earth ground. The neutralizer-cathode could again also be of the hollow-cathode type. To complete the description of FIG. 6, ion-beam target 41 is again electrically isolated from ground, with the potential of this target relative to ground again measured with voltmeter 59.

Figure 7:
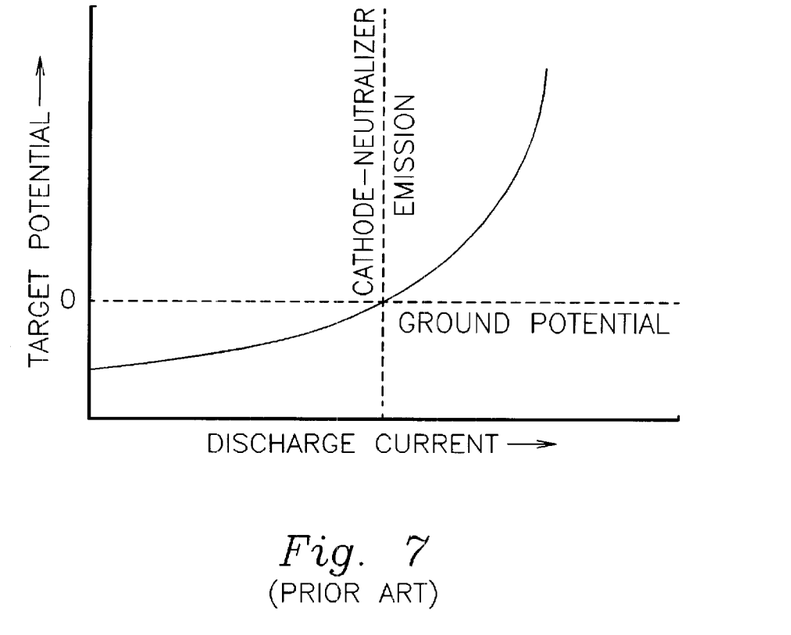
FIG. 7 depicts the variation in potential of an electrically isolated target with ion-source discharge current when the cathode-neutralizer emission is fixed.

The variation of the potential of an electrically isolated ion-beam target with ion-beam current is depicted in FIG. 7 for an ion-beam apparatus corresponding to both FIG. 3 and the electrical schematic of FIG. 6. The cathode-neutralizer is assumed to be operating at a fixed electron emission. The variation of discharge current (the current in discharge supply 66 in FIG. 6) then results in the variation in target potential shown in FIG. 5. Of particular interest is the target potential reaching zero potential relative to ground close to or at a discharge current, $I_d$, equal in magnitude to the cathode-neutralizer emission, $I_e$, The equality $$I_d = I_e \qquad (2)$$

is called current neutralization. The reason for this equality can be demonstrated using FIG. 6. The discharge current leaving volume 62 of ion source 44B consists of electrons from cathode 45 entering that volume and ions leaving that volume to form ion beam 42. This relationship can be expressed as $$I_d = I_e' + I_i \qquad (3)$$

Because of continuity of current, the discharge current, $I_d$, has the same value at the anode. The ions are formed in electron-ion pairs, so that anode current consists of the electron current that flows into ion source 44B, $I_e'$, plus an electron current equal to the ion-beam current leaving that source, $I_i$. The electron current at the anode equals $I_d$ as given by Equation (3), but at the anode the current is almost entirely due to electrons. For a current-neutralized ion beam, the electron emission from cathode-neutralizer 45 must equal $I_e'$ plus an electron current equal to the ion-beam current, $I_i$.

$$I_e = I_e' + I_i \qquad (4)$$

Inasmuch as $I_d$ and $I_e$ are both equal to $I_e' + I_i$, Equation (2) has been demonstrated.

If the discharge current exceeds the cathode-neutralizer current (the ion arrival rate at the target exceeds the electron arrival rate), the target potential will become positive to attract additional electrons, as shown in FIG. 7. If the discharge current is less than the cathode-neutralizer current, the target potential will become negative to repel more of the arriving electrons, as also shown in FIG. 7.

As described in connection with FIG. 5, a target at ground potential does not mean zero potential difference between the ion beam and the target, but it does represent the minimum likelihood of charging damage at the target surface (43 in FIG. 4). For a normally grounded target, satisfying Equation (2) is also consistent with minimizing damage to any thin films or thin-film devices that are involved in an ion-beam process.

The schematic diagram for the Hall-current ion source in FIG. 6 resembles an end-Hall type of Hall-current ion source in that there is a discharge region with only an outside boundary, as shown in U.S. Pat. No. 4,862,032—Kaufman et al. A Hall-current ion source can also be of the closed-drift type where the discharge region has both inner and outer boundaries—see Zhurin, et al., in the aforementioned *Plasma Sources Science & Technology*, Vol. 8, beginning on page R1. However, from an electrical schematic viewpoint, as shown in FIG. 6, there is no significant difference between these two types of Hall-current ion sources, so that.FIG. 6 can serve for both types of Hall-current ion source.

Cathode 45 has been called a cathode-neutralizer in both FIG. 4 and FIG. 6 to emphasize that the function is the same for both gridded and Hall-current ion sources. In both cases current neutralization is obtained by setting the emission from the cathode-neutralizer equal to a current measured in an ion-source power supply—beam supply 54 in FIG. 4 and discharge supply 66 in FIG. 6. There are a number of second-order considerations, such as measurement accuracy and the generally more rapid change in charging when the ion arrival rate exceeds the electron arrival rate, so that small departures from the equalities of Equations (1) and (2) may be used in practice. Even when such departures are used, however, $I_i \approx I_e$ and $I_d \approx I_e$.

Two more items of prior art should be mentioned. One is described in the aforesaid U.S. Pat. No. 4,419,203—Harper, et al. When two ion beams intersect, it is possible to use only one source of neutralizing electrons for the two ion beams because of the electrical conduction from one ion beam to the other.

The other item of prior art is the anode-layer type of closed-drift ion source described in the aforementioned U.S. Pat. No. 6,147,354—Maishev, et al. and U.S. Pat. No. 6,153,067—Maishev, et al. As described in the Background Art section, this type of Hall-current ion source depends on the electron emission from cathode-potential surfaces that results from ion bombardment of those surfaces, from high-field emission, and from neutralization arcs. All of these mechanisms require high electric fields at target surfaces and are inconsistent with low-damage deposition requirements.

DESCRIPTION OF PREFERRED EMBODIMENTS

Figure 8:
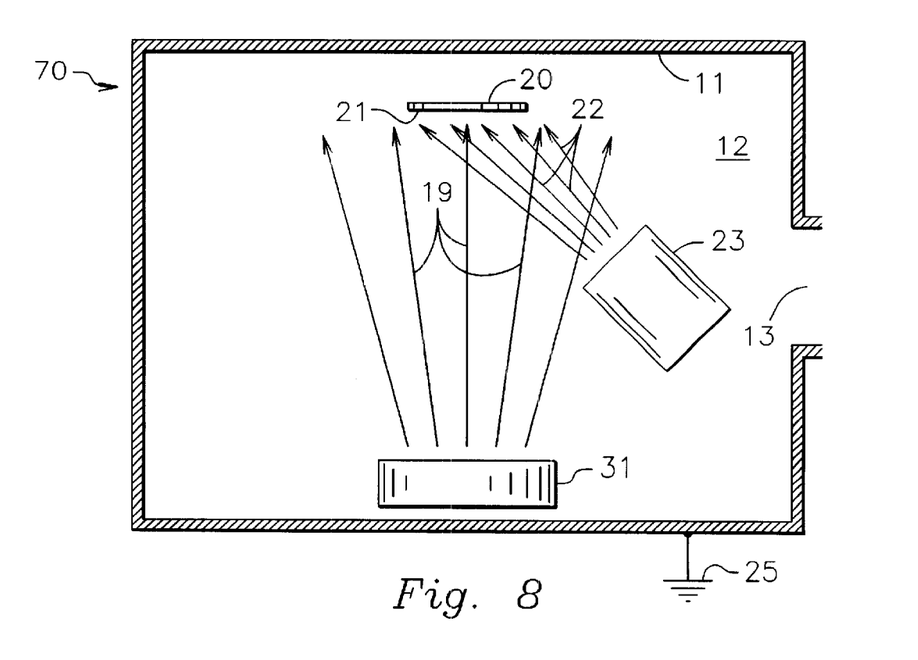
FIG. 8 is an embodiment of the present invention.

Referring to FIG. 8, there is shown ion-assisted magnetron deposition apparatus 70 constructed in accordance with one embodiment of the present invention. This apparatus is generally similar to ion-assisted deposition apparatus 30 in FIG. 2, except for the important omission of cathode-neutralizer 24 shown in FIG. 2 for ion-assist ion source 23.

The operation of the apparatus shown in FIG. 8 also differs significantly from the operation of that shown in FIG. 2. For describing the operation of the apparatus in FIG. 8, it is helpful to refer to FIG. 9, which shows an electrical schematic of the apparatus shown in FIG. 8 where the ion source is of the gridded type. Gridded ion source 23A operates in a manner similar to that of gridded ion source 44A in FIG. 4. There is, however, no cathode-neutralizer (see 45 in FIG. 4) in apparatus 70 or the electrical schematic for this apparatus shown in FIG. 9.

Figure 9:
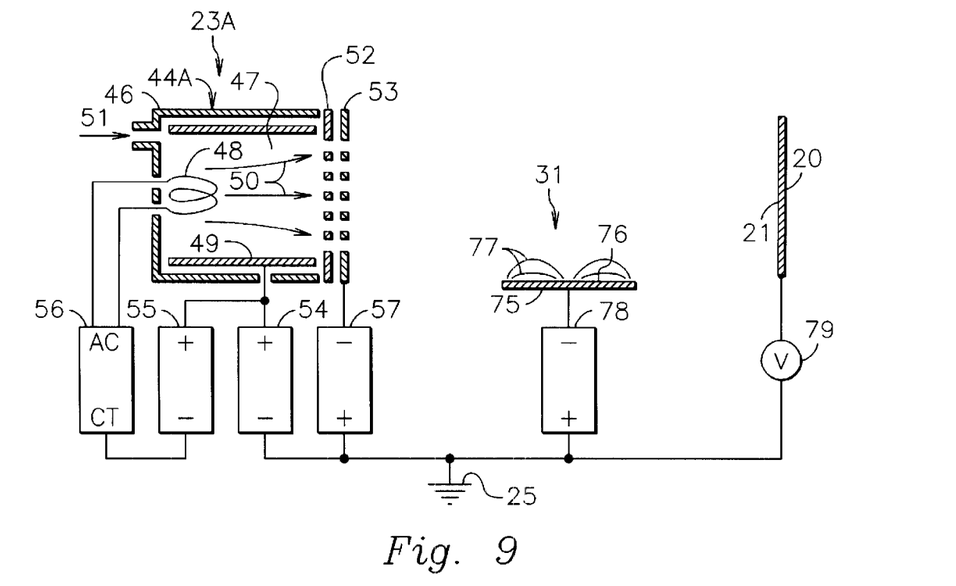
FIG. 9 is an electrical schematic of the apparatus shown in FIG. 8 where the ion source is of the gridded type.
Figure 10:
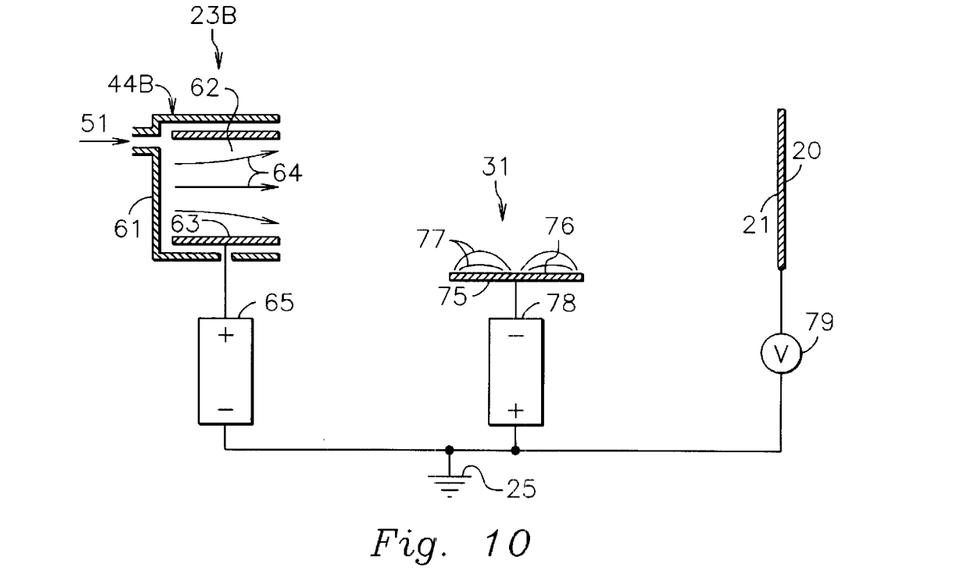
FIG. 10 is an electrical schematic of the apparatus shown in FIG. 8 where the ion source is of the Hall-current type.

The operation of the apparatus in FIG. 8 can alternatively be performed with the arrangement shown in FIG. 10, which is an electrical schematic of the apparatus in FIG. 8 where the ion source is of the Hall-current type. Hall-current ion source 23B operates in a manner similar to that of Hall-current ion source 44B in FIG. 6. Electrons in the discharge again ionize neutral atoms or molecules of ionizable gas 65, with some of the ions formed leaving the ion source to form ion beam 42. The ions in the ion beam have a positive charge that must be neutralized by the addition of neutralizing electrons. There is again no cathode-neutralizer in the arrangement shown in FIG. 10. Before describing the source of these electrons for the ion beam in the electrical schematic of either FIG. 9 or FIG. 10, it is necessary to describe the operation of magnetron 31.

Magnetron 31 in FIGS. 9 or 10 has a sputter target 75 with, exposed surface 76 and magnetic field 77 above the exposed surface. The sputter target surface other than exposed surface 76 is shielded in a manner well known to those skilled in the art. The magnetron operates in a normal manner, starting when voltage of magnetron supply 78 becomes sufficiently large, with that supply thereafter sustaining a discharge current and voltage. Additional details of construction and operation are described by Waits in the aforementioned Chapter II-4 of *Thin Film Processes* (John L. Vossen and Werner Kern, eds.), Academic Press, New York (1978) beginning on page 131. In general, ions collide with the exposed surface of the sputter target, generating both sputtered particles of target material and secondary electrons. The secondary electrons are accelerated away from the negative target, but are contained by the magnetic field until they strike ionizable neutral atoms or molecules in the background gas present in the evacuated volume. These collisions generate additional ions to be attracted toward the negative target, as well as lower energy electrons—both the original secondary electrons and the electrons produced by the ionization process.

The discharge current at the sputter target of a magnetron consists of ions striking the target and secondary electrons from these collisions leaving the target. Most of the ions generated in the discharge are attracted to the target. The discharge current returning to ground must be equal to the discharge current to the target and must consist mostly of electrons. The discharge current to the "anode" (ground in FIGS. 9 or 10) is discussed by Waits in the aforementioned chapter, but little is concluded other than the effective location being close to the magnetron.

It was found experimentally that the electron current from the magnetron could readily be conducted by the diffuse plasma in evacuated volume (12 in FIG. 8) between the magnetron and the ion source so that this electron current could be used to neutralize ion beam 22 from the ion-assist ion source. Further, to match the ion-assist function to the deposition rate, it was helpful to have the ion-assist ion source much closer to the deposition substrate than the magnetron. For that reason, it was important to be able to conduct the electron current over a substantial distance.

The absence of a cathode-neutralizer has several important advantages. The cost of the apparatus is reduced. The cathode-neutralizer is one of the more likely components to fail, and its absence means increased reliability. The cathode-neutralizer can also limit the operating time between maintenance, particularly when operation of the ion source is with a reactive gas such as oxygen or nitrogen. The absence of a cathode-neutralizer can therefore be important in load-lock systems, where long operating times between maintenance are common.

While it is possible to use both gridded and Hall-current types of ion-assist ion sources, the trend toward lower ion-assist ion energies makes the Hall-current type the more likely choice. At the same time, however, there may still be applications where the higher ion energy of a gridded ion source is not a problem and the more precise control of ion beam energy and direction possible with a gridded source are important.

SPECIFIC EXAMPLES

Figure 11:
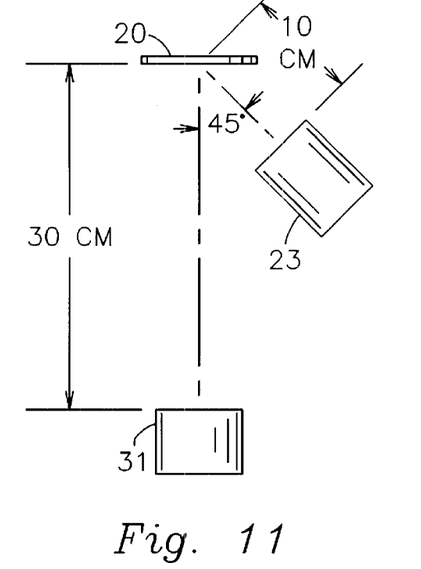
FIG. 11 shows the physical dimensions for one test of the apparatus shown in FIG. 8 where the ion source was of the Hall-current type.

One configuration of FIG. 8 that was tested used the circuit diagram shown in FIG. 10 and the spatial configuration indicated in FIG. 11. The magnetron used was a two-inch diameter Torus Sputter Source marketed by Kurt J. Lesker Company, Clairton, Pa. The ion source was the Mark I End-Hall Ion Source marketed originally by Commonwealth Scientific Corporation, Alexandria, Va., and presently marketed by Veeco Instruments Inc., Plainview, N.Y. This ion source is normally supplied with either a hot-filament or a hollow-cathode type of cathode-neutralizer, but neither was used in this test. The spacings between the magnetron, ion-assist source, and deposition substrate are shown with the magnetron and ion-assist source indicated approximated to scale. An electrically isolated deposition substrate is not necessary for all embodiments of the invention, but was included as a diagnostic in the testing.

Figure 12:
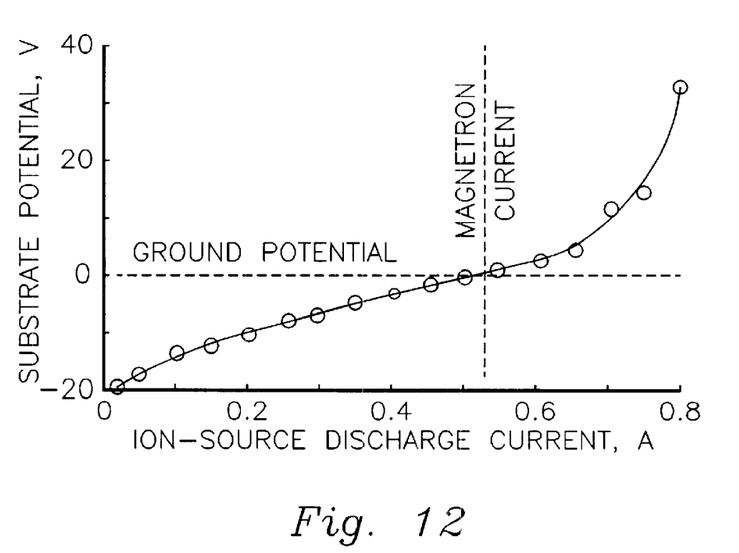
FIG. 12 depicts the variation in potential of the deposition substrate with ion-source discharge current for the specific arrangement shown in FIG. 11 of the apparatus shown in FIG. 8.

For the test results shown in FIG. 12, the only gas introduced into the apparatus was 100 sccm (standard cubic centimeters per minute) of argon through the ion source. The pumping was sufficient to maintain a pressure of about $6 \times 10^{-4}$ Torr ($8 \times 10^{-2}$ Pascal). The magnetron with an aluminum target was operated at 200 W with a current to the sputter target of about 0.53 A. The substrate potential was found to be approximately ground potential when the ion-source discharge current equaled the magnetron current. The ion-assist ion source was thus operated at conditions consistent with low-damage deposition without any cathode-neutralizer.

The specific ion-assist conditions obtained are also of interest. At a power of 200 W and a distance of 30 cm, as shown in FIG. 11, the magnetron was found to deposit an Al film at the rate of about 3 Å/sec. From the manual for the Mark I End-Hall Ion Source, a discharge current of 0.53 A would be expected to generate an ion beam of about 0.1 A with a current density of about 0.6 mA/cm$^2$ at the substrate. The ion-current density and the deposition rate at the substrate corresponded to an ion-atom ratio of about 0.2. At the moderate ion energy of about 24 eV (a discharge voltage of 40 V), this gave a deposition energy of about 5 eV per deposited atom. From the aforesaid chapter 4 by Harper, et al., in *Ion Bombardment. Modification of Surfaces: Fundamentals and Applications*, 5 eV/atom is consistent with many thin-film ion-assist applications.

It is worthwhile to consider the advantages of placing the ion-assist ion source closer to the substrate than the magnetron. One advantage is that this location avoids direct deposition from the magnetron onto critical components of the ion source (anode for a Hall-current source and ion optics for a gridded ion source).

Another advantage has to do with matching at the substrate the deposition rate from the magnetron with the arrival rate of ion-assist ions. If the ion source had been located at the same 30 cm distance as the magnetron, the current density would have benef fitted from being pointed more directly at the substrate (as opposed to the 45 degree angle in FIG. 11), but would have diminished greatly due to the approximately inverse-square decrease that results from the increased distance. The net result would have been a factor of six decrease in ion-current density and an ion-assist energy of less than 1 eV per deposited atom of aluminum. From the above mentioned chapter by Harper, et al., it is unlikely that the ion assist energy would have been large enough to have been of interest. The ability to locate the ion-assist ion source much closer to the substrate than the magnetron is therefore important in matching the operation of the ion-assist ion source to the electron current available from the magnetron. This matching will vary with the particular material being deposited and the particular ion-assist process being used. But the present trend of using increasingly lower ion-assist energies to reduce deposition damage should make this matching increasingly important to reach either stoichiometric ratios or adequate energies per deposited atom.

Figure 13:
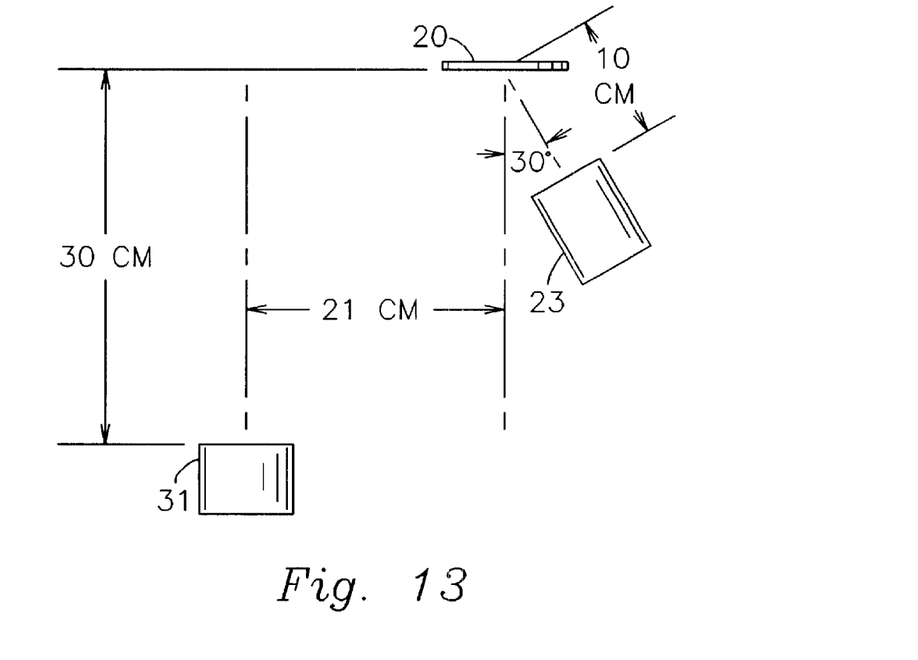
FIG. 13 shows the physical dimensions for another test of the apparatus shown in FIG. 8 where the ion source was of the Hall-current type.

Another configuration of FIG. 8 that was tested also used the circuit diagram shown in FIG. 10, but used the spatial configuration indicated in FIG. 13. The same magnetron and ion-assist ion source were also used. The configuration of FIG. 13 is of interest because an offset location (the 21 cm distance) combined with rotation of the substrate about its axis can result in a much larger region of film-thickness uniformity than the configuration shown in FIG. 11.

Figure 14:
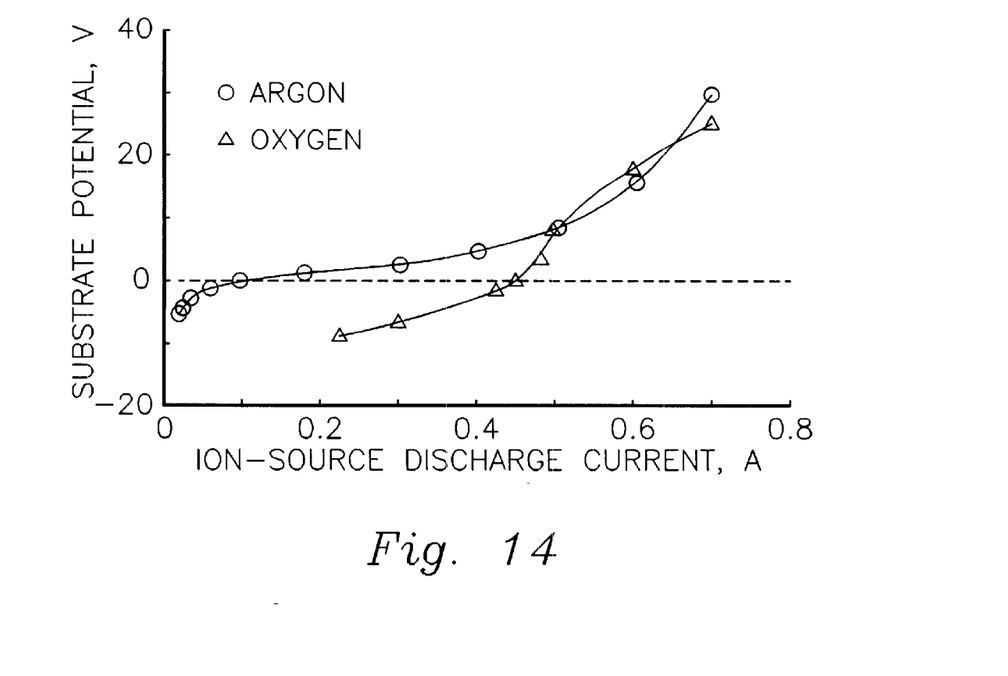
FIG. 14 depicts the variation in potential of the deposition substrate with ion-source discharge current for the specific arrangement shown in FIG. 13 of the apparatus shown in FIG. 8.

For the test results shown in FIG. 14, 100 sccm of argon was introduced into the evacuated volume at a location removed from both the ion source and the magnetron. Then either 15 sccm of argon or oxygen was introduced through the ion source. The pressure in both cases was again about $6 \times 10^{-4}$ Torr. The magnetron with an aluminum target was again operated at 200 W with a current to the sputter target of about 0.39 A with argon through the ion source and 0.43 A with oxygen. Aluminum oxide films with excellent transparency were deposited when oxygen was used in the ion source. The substrate potential was found to be approximately ground potential when the ion-source discharge current equalled the magnetron current for oxygen. For argon, the substrate potential was ground at an ion source discharge current of only 0.1 A. On the other hand, the substrate potential was moderate, not exceeding 5 V, up to a discharge current of 0.4 A, It was thus again possible to operate the ion-assist ion source at conditions consistent with low-damage deposition without any cathode-neutralizer.

In another test, argon gas was introduced only into the evacuated volume, at a location removed from both the ion source and the magnetron. Operation of the ion source was possible, even though no gas was introduced through it. The operating range was more restricted than with gas introduced through the ion source, but it is a possible option.

The closeness of the ion-assist ion source to the substrate should not be a uniformity concern. Thin films are generally less sensitive to moderate variations in the ion-assist beam than in the deposition thickness. For example, Harper, et al., in the aforesaid chapter 4 by Harper, et al., in *Ion Bombardment Modification of Surfaces: Fundamentals and Applications* found that, as long as a sufficiently large ion-current density was used in a reactive-gas ion-assist ion source, the stoichiometry of the compound deposited film was not affected. This is because the excess of reactive gas ions, beyond that required for stoichiometry, did not stick to the depositing film.

ALTERNATE EMBODIMENTS

When examined closely, several specific embodiments are possible for the subject invention. At its simplest level, an ion-assist ion source can be operated with either its ion-beam current (for a gridded ion source) or its discharge current (for a Hall-current ion source) set at a predetermined value that is approximately equal to the current in the magnetron discharge. The cost, reliability, and extended operating time advantages of not having a cathode-neutralizer will be realized. At the same time, the possibility of charging damage to the deposited film should be moderate.

It is possible to use a "floating ground," where the common ground connection shown in either FIG. 9 or FIG. 10 would be electrically isolated from both earth ground and the potential of the vacuum enclosure. The use of a floating ground would force the desired equal emission to take place—either the magnetron current equaling the ion-beam current for a gridded ion source, or the magnetron current equaling the discharge current for a Hall-current ion source.

Figure 15:
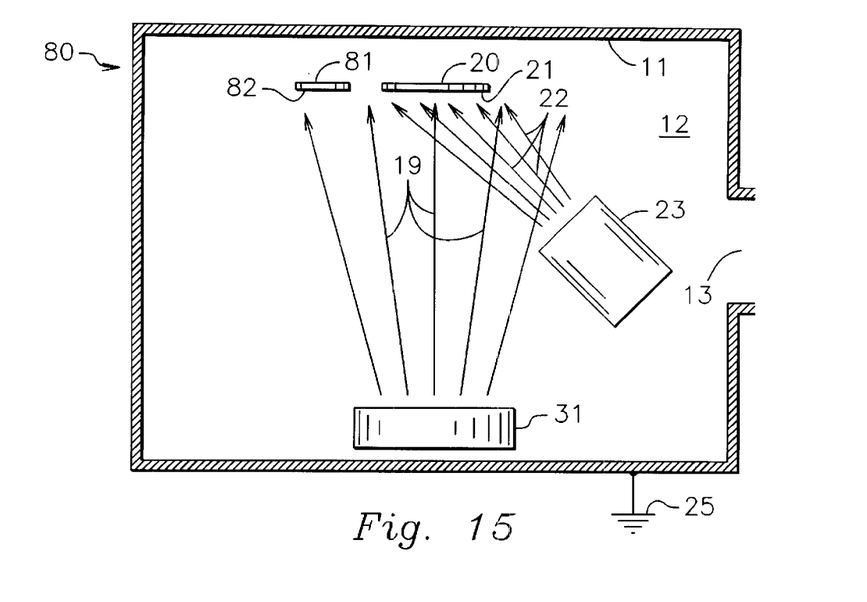
FIG. 15 is an ion-assisted deposition apparatus constructed in accord with another embodiment of the present invention.
Figure 16:
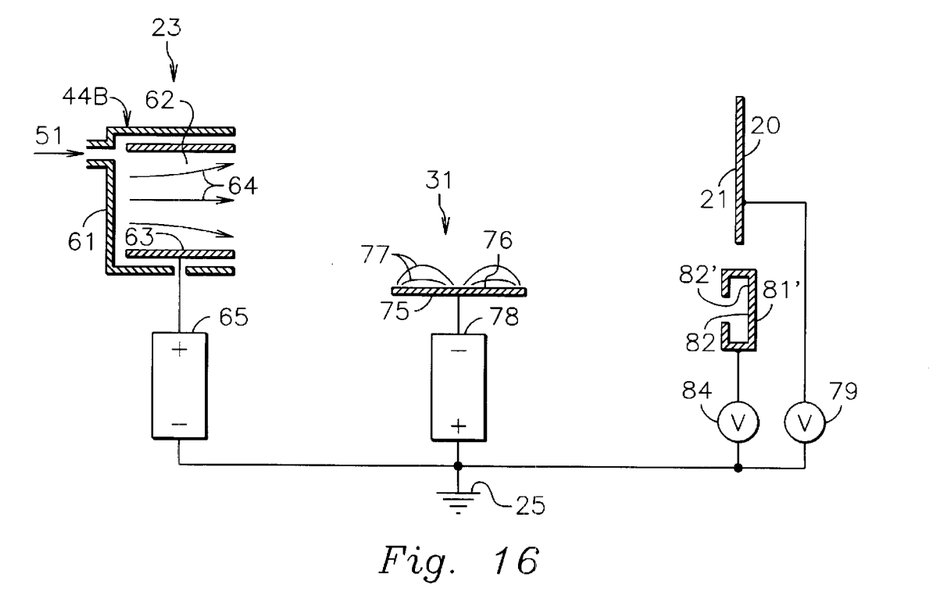
FIG. 16 is an electrical schematic of the apparatus shown in FIG. 15 where the ion source is of the Hall-current type.

For more precise control of substrate charging, the specific configuration and operating condition should be tested with either an electrically isolated substrate or a nearby probe to monitor charging. Apparatus 80 for such testing is shown in FIG. 15, while the electrical schematic for this apparatus is shown in FIG. 16. Except for the addition of probe 81 with exposed surface 82, the apparatus of FIG. 15 is identical with apparatus 70 shown in FIG. 8. In a similar manner, except for the addition of the probe and voltmeter 84 to monitor the probe potential, the electrical schematic of FIG. 16 is identical to the electrical schematic shown in FIG. 10.

If a conducting film is being deposited, the substrate potential can be monitored to permit selection of an operating condition that assures a substrate potential close to ground, which is defined as the potential of the surrounding vacuum enclosure. As mentioned previously, in most but not all applications, the vacuum enclosure potential is also the earth ground.

If a dielectric film is being deposited, the measurement of substrate potential can be difficult or meaningless. The exposed surface of the substrate still reaches a definite potential, but the dielectric coating prevents its measurement by measuring the potential of substrate 20. A planar probe, as indicated in FIG. 15, would be subject to the same measurement problems. A probe with shadowed recesses is an alternative, as indicated in FIG. 16 is a possible alternative. Probe 81 has exposed surface 82 that would be subject to the same dielectric deposition as substrate surface 21, but the probe also has surface 82' that is shadowed from direct deposition of dielectric and could therefore give a reliable indication of the potential of a surface exposed to the ion beam. This potential measurement could then be used to determine the appropriate operating conditions for a production application.

For even more precise control of substrate charging, the substrate potential can be controlled continuously during all operation. If the substrate can be electrically isolated from the vacuum enclosure and the deposited film is conducting, the substrate potential can be measured with voltmeter 79 and this potential can be held at a predetermined value. If the voltage of the substrate increases above this value, either the magnetron discharge current could be increased or the discharge current of the Hall-current ion source decreased. The ion-beam current could be decreased instead of the discharge current if a gridded type of ion-assist ion source were used, instead of a Hall-current type. Conversely, if the voltage of the substrate decreases below a predetermined value, either the magnetron discharge current could be decreased or the discharge current of the Hall-current ion source increased.

If it is not practical to isolate the substrate from ground, a probe can be located near the substrate to provide a potential measurement. Other than using the probe potential rather than the substrate potential, the control procedure would be as described above.

If a dielectric was being deposited, a probe with shadowed regions to assure an exposed conductive surface could be used for a potential measurement.

The preceding discussion of alternate embodiments generally assumes a predetermined value of substrate potential that is close to the potential of the surrounding vacuum enclosure. It may also be desirable to have this predetermined value at some other potential, such as slightly positive of the vacuum enclosure to minimize the likelihood of neutralization arcs, or slightly negative of the vacuum enclosure to provide a controlled bombardment of the substrate by low-energy background ions.

While particular embodiments of the present invention have been shown and described, and various alternatives have been suggested, it will be obvious to those of ordinary skill in the art that changes and modifications may be made without departing from the invention in its broadest aspects. Therefore, the aim in the appended claims is to cover all such changes and modifications as fall within the true spirit and scope of that which is patentable.

We claim:

1. An ion-assisted magnetron deposition apparatus comprising:
   a magnetron having a discharge current;
   a deposition substrate displaced from said magnetron;
   an ion source for generating an ion beam having an ion-beam current, without an electron-emitting cathode-neutralizer, displaced from said magnetron and located so that said ion beam is directed at said substrate; and
   power supply means which is adapted to maintain said magnetron discharge current approximately equal to said ion beam current.

2. An ion-assisted magnetron deposition apparatus as defined in claim 1 wherein said ion source is located closer to said deposition substrate than said magnetron.

3. An ion-assisted magnetron deposition apparatus as defined in claim 1 wherein said ion source is of a gridded ion source.

4. An ion-assisted magnetron deposition apparatus as defined in claim 1 wherein said ion source is a Hall-current source having a discharge current.

5. A method for sputtering material from a sputter target onto a deposition substrate within an evacuated chamber, the method comprising the steps of:
   (a) providing a magnetron means, with said magnetron means incorporating said sputter target, biased negative to produce a magnetron discharge current;
   (b) providing a deposition substrate, displaced from said magnetron means, upon which sputtered material from said sputter target is deposited;
   (c) providing an ion source means for producing an ion beam having a current, without an electron-emitting cathode-neutralizer, located so as to direct said ion beam at said deposition substrate; and
   (d) controlling said current of said ion beam to maintain said potential of said deposition substrate at a predetermined value.

6. A method in accordance with claim 5, wherein a probe having a potential measured relative to said evacuated chamber is located proximal to said deposition substrate and wherein said ion source means is operated so as to maintain said potential of said probe at a predetermined value.

7. A method in accordance with claim 5, wherein said ion source means is a gridded ion source and said current of said ion beam is controlled so as to be approximately equal in magnitude to said magnetron discharge current.

8. A method in accordance with claim 5, wherein said ion source means is a Hall-current ion source having a discharge current which is controlled to be approximately equal in magnitude to said magnetron discharge current.

* * * * *